(12) United States Patent
Molendijk et al.

(10) Patent No.: US 12,418,306 B2
(45) Date of Patent: Sep. 16, 2025

(54) INTER-SYMBOL INTERFERENCE COMPENSATION FOR ANALOG-TO-DIGITAL CONVERTER

(71) Applicant: NXP B.V., Eindhoven (NL)

(72) Inventors: Maarten Jelmar Molendijk, Eindhoven (NL); Robert van Veldhoven, Valkenswaard (NL)

(73) Assignee: NXP B.V., Eindhoven (NL)

( * ) Notice: Subject to any disclaimer, the term of this patent is extended or adjusted under 35 U.S.C. 154(b) by 128 days.

(21) Appl. No.: 18/218,366

(22) Filed: Jul. 5, 2023

(65) Prior Publication Data

US 2025/0015814 A1 Jan. 9, 2025

(51) Int. Cl.
*H03M 3/00* (2006.01)

(52) U.S. Cl.
CPC .................................. *H03M 3/354* (2013.01)

(58) Field of Classification Search
CPC ...... H03M 3/354; H03M 3/376; H03M 3/458; H03M 3/344; H03M 3/02
See application file for complete search history.

(56) References Cited

U.S. PATENT DOCUMENTS

| | | | |
|---|---|---|---|
| 6,535,153 B1 * | 3/2003 | Zierhofer | H03M 3/49 375/247 |
| 8,144,043 B2 | 3/2012 | Risbo et al. | |
| 8,670,512 B1 * | 3/2014 | Wang | H04L 7/033 375/357 |
| 9,077,571 B2 * | 7/2015 | van de Beek | H04L 25/03343 |
| 11,101,810 B1 | 8/2021 | Veldhoven | |
| 12,170,874 B2 | 12/2024 | Straeussnigg et al. | |
| 2004/0113824 A1 * | 6/2004 | Zierhofer | H03M 3/482 341/118 |
| 2006/0214829 A1 * | 9/2006 | Takeuchi | H03M 3/344 341/143 |
| 2012/0306673 A1 | 12/2012 | Ueno | |
| 2013/0064271 A1 * | 3/2013 | van de Beek | H04L 25/03343 375/232 |
| 2019/0334545 A1 * | 10/2019 | Quiquempoix | H03M 3/464 |
| 2022/0019883 A1 | 1/2022 | Veldhoven | |

OTHER PUBLICATIONS

Si Chen and Boris Murmann, An 8-bit 1.25GS/s CMOS IF-Sampling ADC with Background Calibration for Dynamic Distortion, Nov. 7-9, 2016, IEEE, 978-1-5090-3700-1, pp. 69-72 (Year: 2016).*

(Continued)

*Primary Examiner* — Lam T Mai

(57) ABSTRACT

A device may include a sigma-delta analog-to-digital converter (ADC) configured to convert an analog input signal to a digital signal that is a digital approximation of the analog input signal. A bitstream modifier is configured to receive the digital signal, output a first signal that is based on the digital signal at a first output terminal and output a first difference signal at a second output terminal that includes a first difference value between a first value of the digital signal and a second value of the digital signal. The second value is immediately prior to the first value in the digital signal. An error correction system is configured to receive the first signal, receive the first difference signal, use the first signal and the first difference signal to determine a correction value, and modify the digital signal to generate a corrected digital signal by applying the correction value.

20 Claims, 10 Drawing Sheets

(56) References Cited

OTHER PUBLICATIONS

Dolhansky, B., "Artificial Neural Networks: Linear Regression (Part 1)", Retrieved from the Internet: URL:https://www.briandolhansky.com/blog/artificial-neural-networks-linear-regression-part-1 [retrieved on Nov. 14, 2024] Section "Training a neural network to perform linear regression", Jul. 2013.

O'Donoghue, K., "A Digitally Corrected 5-m W 2-MS/s SC $\Delta\Sigma$ ADC in 0.25-μm CMOS With 94-dB SFDR", IEEE Journal of Solid-State Circuits, vol. 46, No. 11, Nov. 2011.

U.S. Appl. No. 18/215,003, filed Jun. 27, 2023, entitled "ADC Error Compensation Using Powers of ADC Output".

U.S. Appl. No. 17/648,584, filed Jan. 21, 2022.

U.S. Appl. No. 18/201,085, filed May 23, 2023, entitled "Time Interleaved Analog-To-Digital Converter With ADC Unit Correction".

Danfeng Zhai et al., High-Speed and Time-Interleaved ADCs Using Additive-Neural-Network-Based Calibration for Nonlinear Amplitude and Phase Distortion, IEEE Transactions on Circuits and Systems-I: Regular Paper, Apr. 2022, pp. 1-14, IEEE, China.

Baccigalupi, A., "Error compensation of A/D converters using neural networks", IEEE Transactions on Instrumentation and Measurement ( vol. 45, Issue: 2, Apr. 1996).

Bernieri, A., "ADC neural modeling", Proceedings of 1995 IEEE Instrumentation and Measurement Technology Conference—IMTC '95, Apr. 23-26, 1995.

Bernieri, A., "ADC neural modeling", IEEE Transactions on Instrumentation and Measurement ( vol. 45, Issue: 2, Apr. 1996).

Chen, S., "An 8-bit 1.25GS/s CMOS IF-Sampling ADC with Background Calibration for Dynamic Distortion", IEEE, 978-1-5090-3700-1, pp. 69-72 (Year: 2016), Nov. 7-9, 2016.

Non-final office action dated Apr. 17, 2025 in U.S. Appl. No. 18/215,003.

\* cited by examiner

US 12,418,306 B2

INTER-SYMBOL INTERFERENCE COMPENSATION FOR ANALOG-TO-DIGITAL CONVERTER

TECHNICAL FIELD

Errors in analog to digital converters (ADCs) are compensated by use of an error correction system, which may implement a machine learning engine. The error correction system is configured to compensate for inter-symbol interference that may arise in various ADCs, such as sigma-delta ADCs.

BACKGROUND

In electronics, an analog-to-digital converter ("ADC") is a system that converts an analog signal, such as a sound picked up by a microphone or light entering a digital camera, into a digital signal. An ADC may also provide an isolated measurement when implemented as an electronic device that converts an input analog voltage or current to a digital number representing the magnitude of the voltage or current.

More specifically, an ADC converts a continuous-time and continuous-amplitude analog signal to a discrete-time and discrete-amplitude output digital signal. The conversion involves quantization of the input, so the process necessarily introduces a small amount of error or noise. Furthermore, instead of continuously performing the conversion, an ADC does the conversion periodically, sampling the input signal at a sampling rate, thus limiting the allowable bandwidth of the input signal.

Continuous-Time sigma-delta ($\Sigma\Delta$) modulators can suffer signal degradation due to inter-symbol-interference when using a non-return-to-zero coding scheme. This can result in falling and rising-edge errors, as well as positive and negative glitch errors in sigma-delta modulators outputting a series of identical symbols.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter of the application and uses of such embodiments. As used herein, the words "exemplary" and "example" mean "serving as an example, instance, or illustration." Any implementation or embodiment described herein as exemplary, or an example is not necessarily to be construed as preferred or advantageous over other implementations. Furthermore, there is no intention to be bound by any expressed or implied theory presented in the preceding technical field, background, or the following detailed description.

Analog-to-digital converters (ADCs) can suffer, like any circuit, from signal degradation due to circuit non-linearities. Sigma-delta modulators are ADCs configured to generate a digital output bit stream in the forms of a sequence of symbols (which may comprise single bits) where the average magnitude of the output symbols is equal to or equivalent to the magnitude of the sigma-delta modulator's analog input signal.

Figure 1:
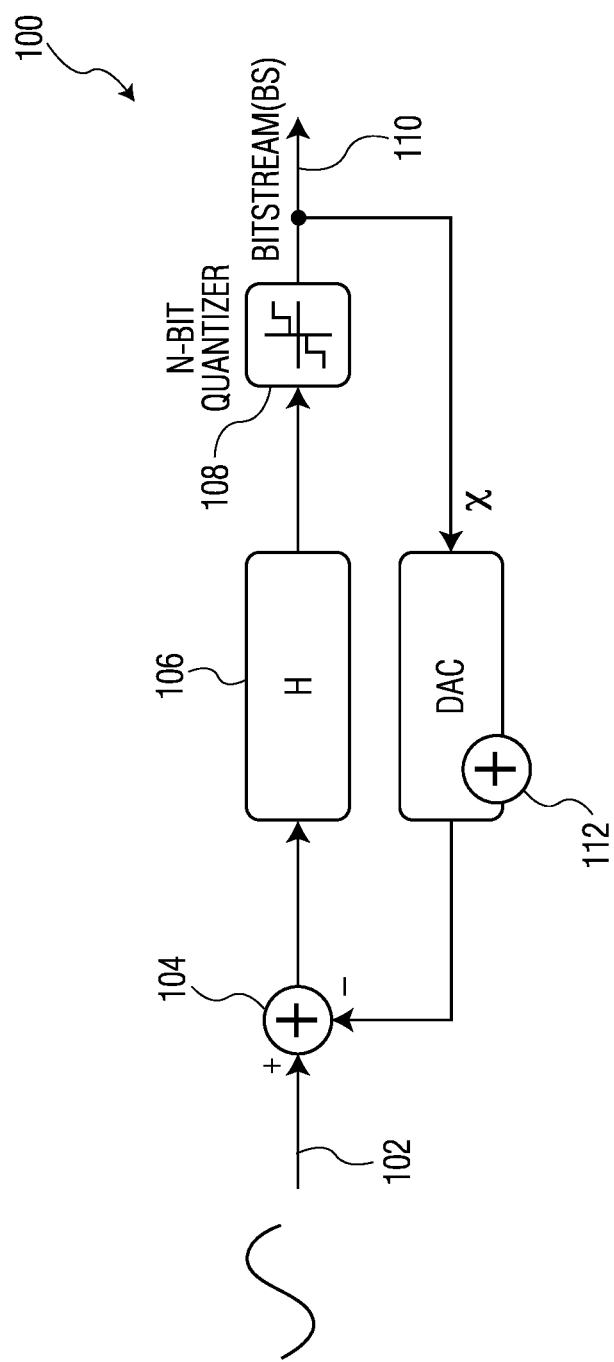
FIG. 1 is a block diagram depicting components of an example sigma-delta modulator 100.

FIG. 1 is a block diagram depicting components of an example sigma-delta modulator 100. Sigma-delta modulator 100 includes an input terminal 102 configured to receive an analog input signal. The input signal is passed through summing node 104 to loop filter 106 that may include a discrete or continuous-time analog filter. The output of loop filter 106 is supplied to quantizer 108, which is configured to convert the output of the integration stages to an amplitude- and time-discrete (i.e., digital) value or symbol which is output as a digital signal at output terminal 110.

The digital signal output at output terminal 110 by sigma-delta modulator 100 is also passed back through digital-to-analog converter 112, which is configured to convert the output digital signal back into a corresponding analog signal. Ideally, the analog signal generated by digital to analog converter 112 is an exact match to the input signal originally received at input terminal 102. The analog output of digital to analog converter 112 is supplied to a negative input to summing node 104.

In this configuration digital-to-analog converter 112 provides a feedback loop that enables the analog signal output by digital to analog converter 112 to be subtracted from the analog input signal received at input terminal 102. The result of that subtraction is supplied to loop filter 106. In this manner, sigma-delta modulator 100 is configured to generate a digital output bit stream having an average power level that matches the power level of the modulator's analog input signal.

Inter-symbol interference (ISI) in the output of continuous-time sigma-delta modulators can reduce the integrity of the modulator's output signal. Specifically, when the modulator's output comprises a sequence of symbols that comprise digital values, the value of a particular symbol in the output signal can have an effect on the immediately following symbol. As such, there is some dependency between consecutive output symbols.

Figure 2:
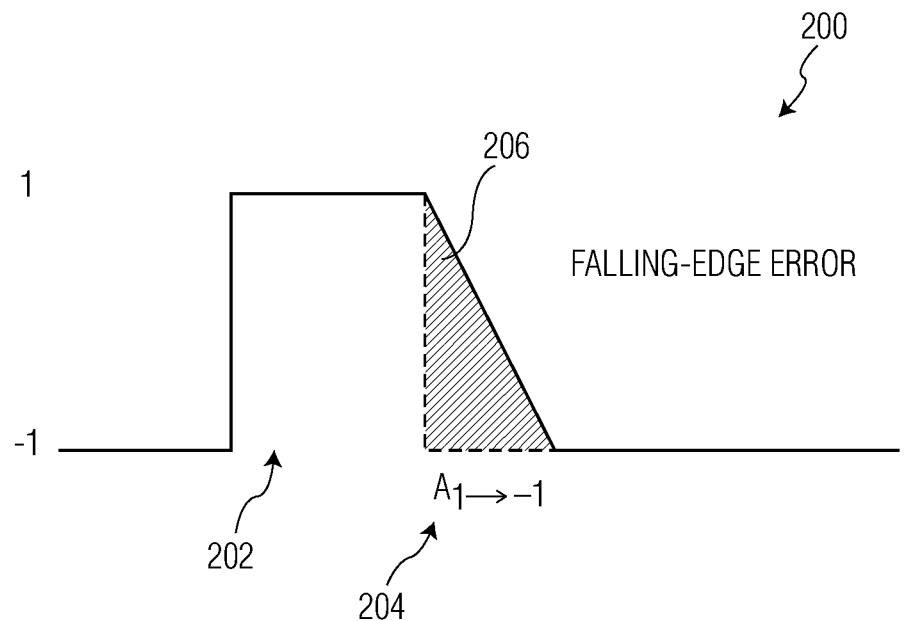
FIG. 2 depicts inter-symbol interference in the output signal of a sigma-delta modulator in a transition from a first symbol having a value of '1' to a second symbol having a value of '−1' (i.e., a "falling-edge" error).

FIGS. 2-5 are charts illustrating inter-symbol interference that may arise in the digital output signal of a sigma-delta modulator. FIG. 2 depicts inter-symbol interference 200 in the output signal of a sigma-delta modulator in a transition from a first symbol 202 having a value of '1' to a second symbol 204 having a value of '−1' (i.e., a "falling-edge" error). Specifically, the inter-symbol interference is represented by shaded region 206 which results because the actual value of the second symbol 204 takes some time to fully transition to the −1 value. This delay results in an inaccuracy or error in the output of the sigma-delta modulator, which may require correction.

Figure 3:
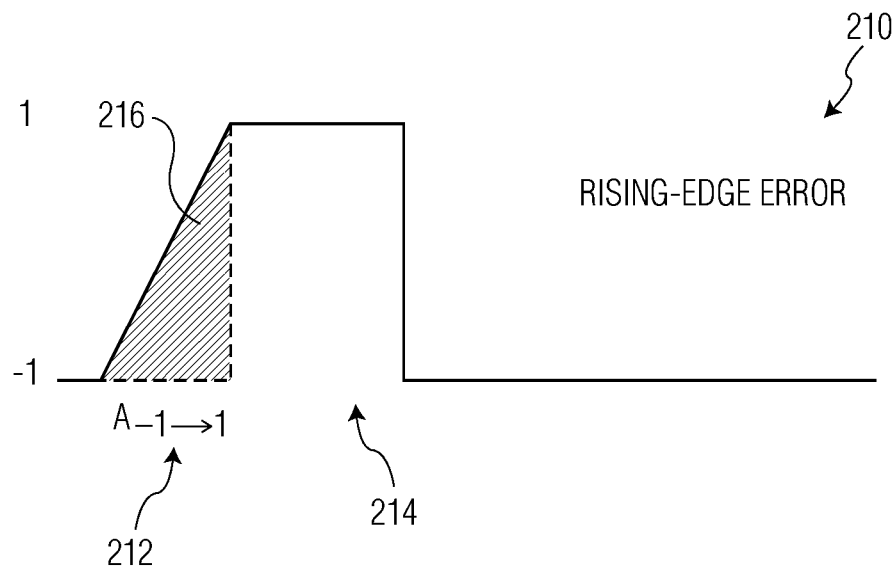
FIG. 3 depicts inter-symbol interference in the output signal of a sigma-delta modulator in a transition from a first symbol having a value of '−1' to a second symbol having a value of '1' (i.e., a "rising-edge" error).

FIG. 3 depicts inter-symbol interference 210 in the output signal of a sigma-delta modulator in a transition from a first symbol 212 having a value of '−1' to a second symbol 214 having a value of '1' (i.e., a "rising-edge" error). Specifically, the inter-symbol interference is represented by shaded region 216 which results because the actual value of the second symbol 214 takes some time to fully transition to the 1 value. This delay results in an inaccuracy or error in the output of the sigma-delta modulator, which may require correction.

Figure 4:
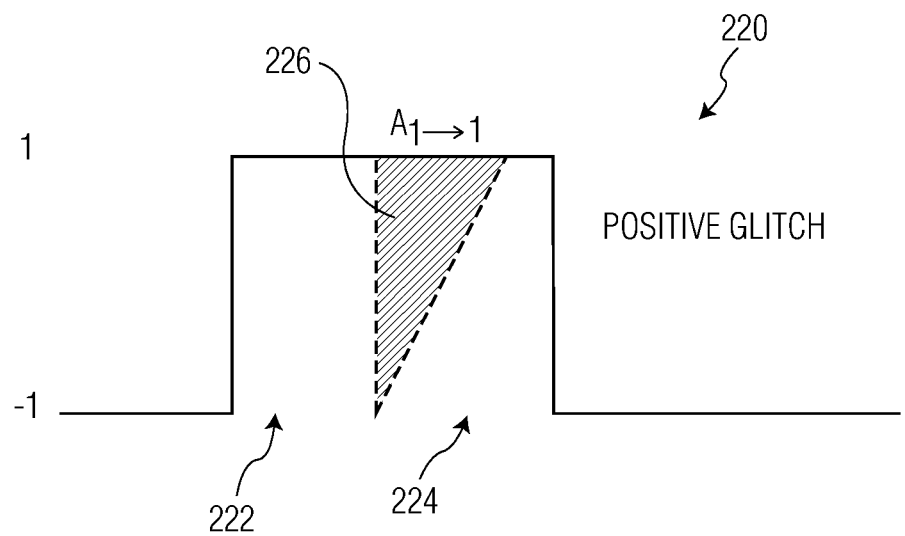
FIG. 4 depicts inter-symbol interference in the output signal of a sigma-delta modulator where the output includes a first symbol and a consecutive second symbol each having values of '1' (i.e., a "positive glitch" error).

FIG. 4 depicts inter-symbol interference 220 in the output signal of a sigma-delta modulator where the output includes a first symbol 222 and a consecutive second symbol 224 each having values of '1' (i.e., a "positive glitch" error). Specifically, the inter-symbol interference is represented by shaded region 226 which is generated due to interference resulting from the two sequential identical values. This results in an inaccuracy or error in the output of the sigma-delta modulator, which may require correction.

Figure 5:
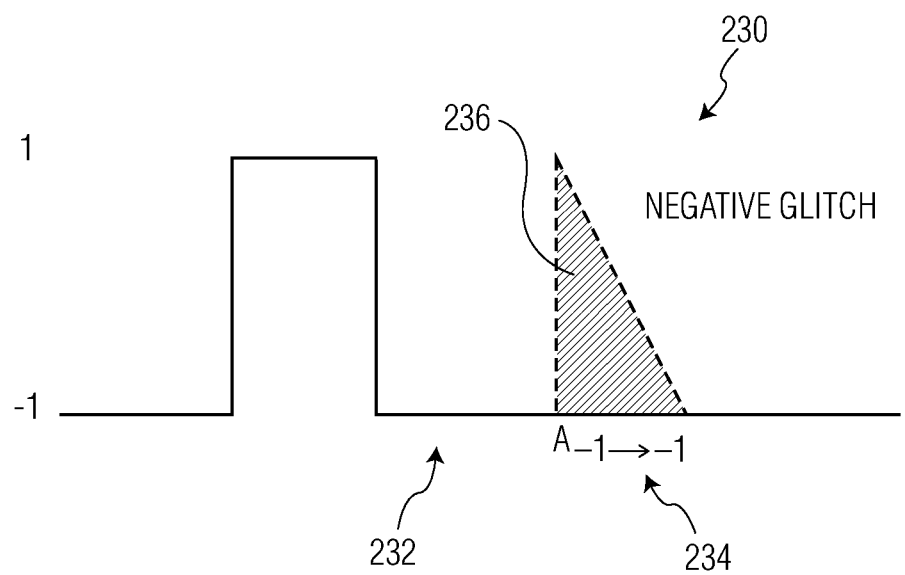
FIG. 5 depicts inter-symbol interference in the output signal of a sigma-delta modulator where the output includes a first symbol and a consecutive second symbol each having values of '−1' (i.e., a "negative glitch" error).

FIG. 5 depicts inter-symbol interference 230 in the output signal of a sigma-delta modulator where the output includes a first symbol 232 and a consecutive second symbol 234 each having values of '−1' (i.e., a "negative glitch" error). Specifically, the inter-symbol interference is represented by shaded region 236 which is generated due to interference resulting from the two sequential identical values. This results in an inaccuracy or error in the output of the sigma-delta modulator, which may require correction.

During operations, signal modulation inside the sigma-delta modulator's ADC creates output signal pulses based on the analog input signal received by the modulator. When the amplitude of the analog input signal is zero or nearly zero, the sigma-delta modulator's output signal will comprise a series of alternating symbols having an average value of zero or nearly zero. In that alternating bitstream, the falling- and rising-edge errors (e.g., as depicted in FIGS. 2 and 3) will be most apparent when the amplitude of the input is close to zero. On the other hand, when the analog input signal is at its maximum values (either positive or negative), the sigma delta modulator's output will tend to be a stream of consecutive '1s' or '−1s', therefore being most sensitive to positive and negative glitches, which leads to even-order distortions.

Figure 6:
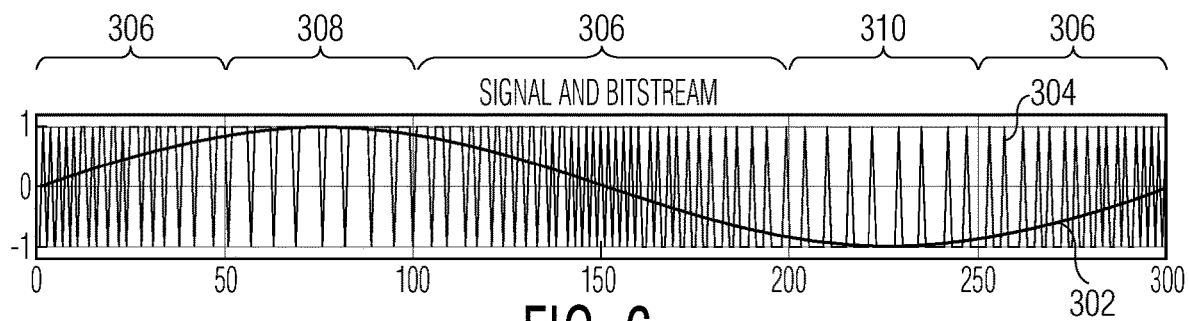
FIG. 6 is a chart depicting an example analog input signal and the corresponding output bit stream that may be generated by an example sigma delta modulator.

These various types of distortion are illustrated in FIGS. 7-10. FIG. 6 is a chart depicting an example analog input signal 302 (which, in this example, approximates a sine wave) and the corresponding output bit stream 304 that may be generated by an example sigma delta modulator. In FIG. 6, the horizontal axis represents time (i.e., sample number) while the vertical axis represents magnitude, which may range from a maximum unitless value of '1' to a minimum value of '−1' in this example.

As depicted in FIG. 6, the analog input signal 302 has regions 306 where the value of the analog input signal is transitioning between values near the maximum value 1 and the minimum value −1 and so have average values at or near zero. Those regions 306 represent time periods during which the output bit stream 304 switches at its highest frequency. Consequently, regions 306 of output bit stream 304 are most likely to suffer from falling-edge and rising-edge error or noise, which are depicted in FIGS. 2 and 3, respectively.

The analog input signal 302 has regions 308 in which the value of the analog input signal is at or near its maximum value 1. As such, those regions 306 represent time periods during which the value of output bit stream 304 are most likely to suffer from positive glitches, which are depicted in FIG. 4.

The analog input signal 302 has regions 310 in which the value of the analog input signal is at or near its minimum value −1. As such, those regions 310 represent time periods during which the value of output bit stream 304 are most likely to suffer from negative glitches, which are depicted in FIG. 5.

Figure 7:
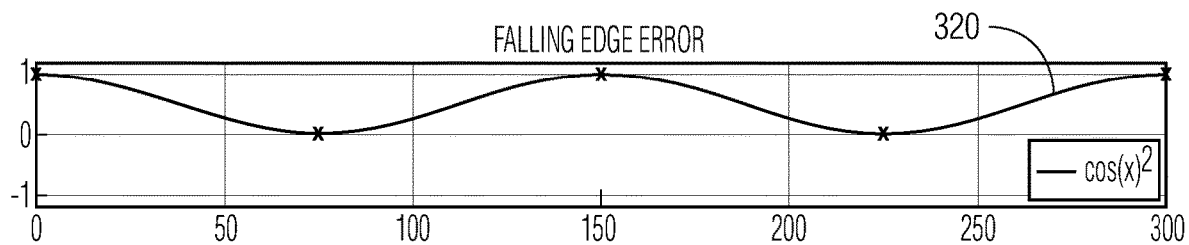
FIG. 7 is a chart depicting the falling-edge error signal that is generated based on the analog input signal shown in FIG. 6.

FIG. 7 is a chart depicting the falling-edge error signal that is generated based on the analog input signal 302 shown in FIG. 6. In FIG. 7, the horizontal axis represents time, which is aligned with the horizontal axis of FIG. 6, and the vertical axis represents magnitude, which may range from a maximum unitless value of '1' to a minimum value of '−1'. In FIG. 7, the falling-edge error signal is made up of a signal represented by curve 320. When the value of the analog input signal 302 is designated sin(x), the falling-edge error signal depicted by curve 320 generally has the form cos(x)$^2$. This falling-edge error signal can be derived by inspecting the density of certain type of errors (in this case, falling-edge errors) in the different time regions 306, 308, and 310. In this example, the error signal has a sinusoidal form, however for other input signal the falling-edge error signal may have a different shape.

Figure 8:
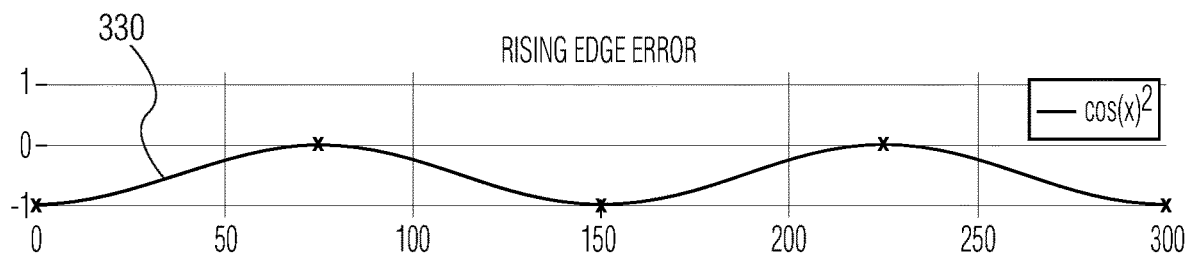
FIG. 8 is a chart depicting the rising-edge error signal that is generated based on the analog input signal shown in FIG. 6.

FIG. 8 is a chart depicting the rising-edge error signal that is generated based on the analog input signal 302 shown in FIG. 6. In FIG. 8, the horizontal axis represents time, which is aligned with the horizontal axis of FIG. 6 and the vertical axis represents magnitude, which may range from a maximum unitless value of '1' to a minimum value of '−1'. In FIG. 8, the rising-edge error signal is made up of a signal represented by curve 330. When the value of the analog input signal 302 is designated sin(x), the rising-edge error signal depicted by curve 320 generally has the form −cos $(x)^2$. This rising-edge error signal can be derived by inspecting the density of certain type of errors (in this case, rising-edge errors) in the different time regions 306, 308, and 310. In this example, the error signal has a sinusoidal form, however for other input signal the rising-edge error signal may have a different shape.

Figure 9:
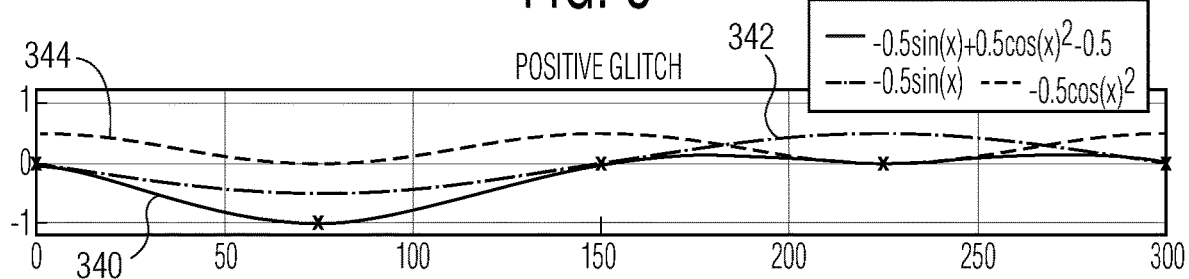
FIG. 9 is a chart depicting the positive-glitch error signal that is generated based on the analog input signal shown in FIG. 6.

FIG. 9 is a chart depicting the positive-glitch error signal that is generated based on the analog input signal 302 shown in FIG. 6. In FIG. 9, the horizontal axis represents time, which is aligned with the horizontal axis of FIG. 6 and the vertical axis represents magnitude, which may range from a maximum unitless value of '1' to a minimum value of '−1'. In FIG. 9, the positive-glitch error signal is made up of a signal represented by curve 340 which is the sum of the curves 342, and 344.

Figure 10:
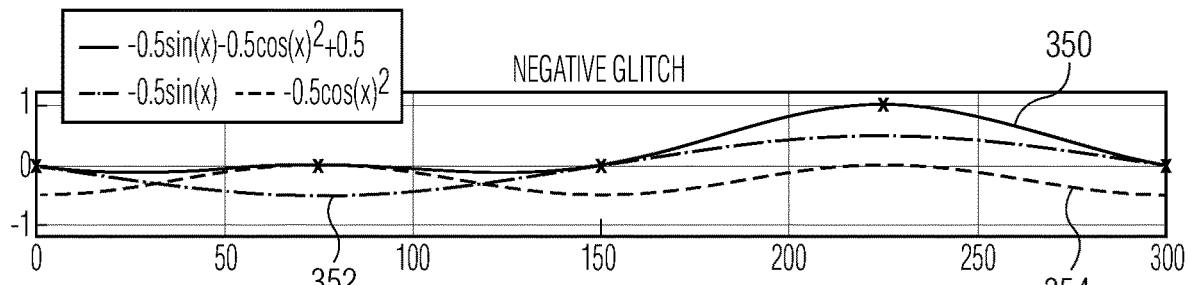
FIG. 10 is a chart depicting the negative-glitch error signal that is generated based on the analog input signal shown in FIG. 6.

When the value of the analog input signal 302 is designated sin(x), the positive-glitch error signal depicted by curve 340 (which is the sum of curves 342 and 344) generally has the form of $-0.5 \sin(x)+0.5 \cos(x)^2-0.5$ FIG. 10 is a chart depicting the negative-glitch error signal that is generated based on the analog input signal 302 shown in FIG. 6. In FIG. 10, the horizontal axis represents time, which is aligned with the horizontal axis of FIG. 6 and the vertical axis represents magnitude, which may range from a maximum unitless value of '1' to a minimum value of '−1'. In FIG. 10, the negative-glitch error signal is made up of a signal represented by curves 350, 352, and 354. When the value of the analog input signal 302 is designated sin(x), the negative-glitch error signal depicted by curve 350 (which is the sum of curves 352 and 354) generally has the forms of $-0.5 \sin(x)-0.5 \cos(x)^2+0.5$.

In a sigma-delta modulator, non-linearities in the feedback loop DAC of the sigma-delta modulator can create intermodulation (IM) products, which can have the effect of reducing the signal-to-noise (SNR) ratio of the sigma-delta modulator due to the specific noise-shaping characteristics of the sigma-delta modulator. Specifically, a sigma-delta modulator is generally configured to shape the device's quantization noise (N_quant) such that most of the quantization noise is moved to the upper frequencies of the spectrum of the modulator's output signal (enabling those noise signals to be filtered via a suitably configured low-pass filter). The non-linearities introduced by ISI (i.e., the falling-edge, rising-edge, positive glitch, and negative glitches noise or error signals) can create intermodulation products between these high-frequency quantization noise components, which can result in the high-frequency noise being folded back into the band of interest (N_foldback) thus degrading the SNR of the sigma-delta modulator. This phenomenon is illustrated by FIGS. 11 and 12.

Figure 11:
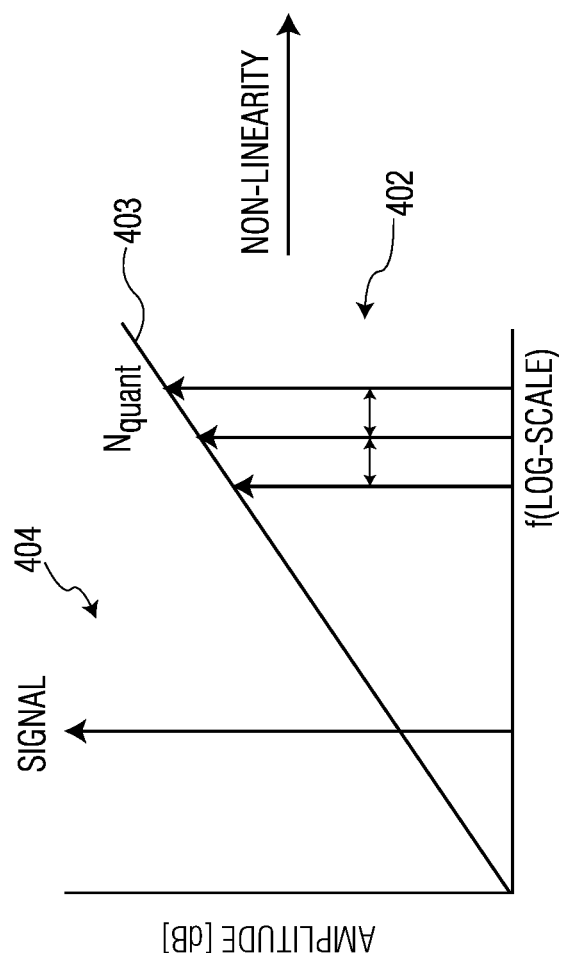
FIG. 11 is a chart depicting a conventional representation of the frequency-domain noise characteristics in the output signal of a sigma-delta modulator.

FIG. 11 is a chart depicting a conventional representation of the frequency-domain noise characteristics in the output signal of a sigma-delta modulator. The horizontal axis represents frequency (on a log scale), while the vertical axis represents signal magnitude at the corresponding frequency. As shown in FIG. 11, as conventionally understood, the majority of noise in the output signal (represented by arrows 402) is in the higher frequencies of the output spectrum of the output signal. As such, the noise represented by arrows 402 is separated (in the frequency domain) from the output signal of the modulator (represented by arrow 404), enabling a low-pass filter to be utilized to remove the high-frequency noise components from the output signal of the sigma-delta modulator. This capacity results in a noise floor that is relatively low at frequencies of interest (see the shape of noise floor 403).

Figure 12:
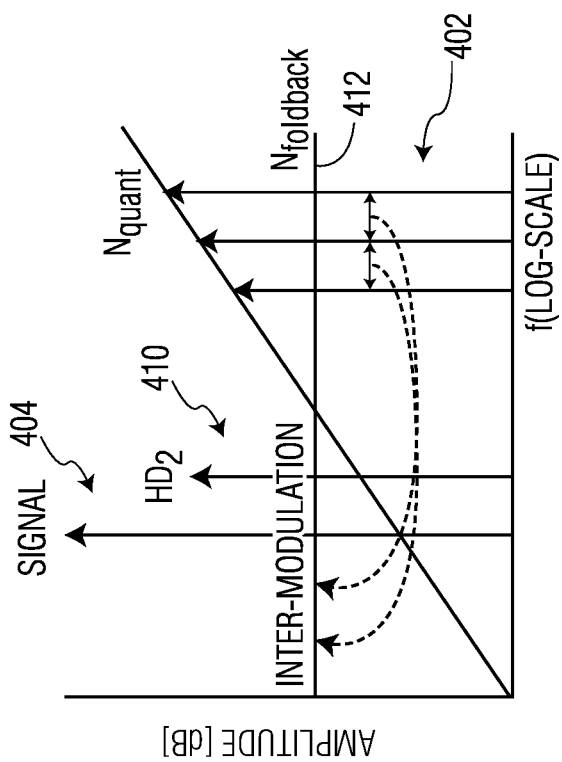
FIG. 12 is a chart depicting the frequency-domain noise characteristics in the output signal of a sigma-delta modulator of FIG. 11 taking into account non-linearities introduced by inter-symbol interference.

FIG. 12 is a chart depicting the frequency-domain noise characteristics in the output signal of a sigma-delta modulator of FIG. 11 taking into account non-linearities introduced by ISI. In FIG. 12, the horizontal axis represents frequency (on a log scale), while the vertical axis represents signal magnitude at the corresponding frequency. As shown in FIG. 12, the non-linearities result in a harmonic component (arrow 410) that appears at frequencies nearby those of the signal component (arrow 404) in the modulator's output signal. Additionally, the non-linearities result in new ISI frequency components that lie at the difference between every combination of frequency components (intermodulation products), which in the case of N_quant, will result in folding of noise back to the signal band of interest causing an in-band noise-floor increase, shown as N_foldback 412, which reduces the ability to filter noise from the output signal of the modulator.

This disclosure provides an approach for correcting the non-linearities created by ISI in a sigma-delta modulator using modifications of the modulator's output bitstream, where the modifications have similar spectral content as the distortions originally introduced by ISI. These modified bitstreams serve as an input to an error correction system that will modify or scale each bitstream input to correct these non-linearities. The modified bitstream signals enable compensation for not only the harmonic components of the distortion, but also for the quantization noise (Q-noise) folding effect in the modulator's output.

In the present disclosure, the error correction system may be implemented as a numerical optimizer or neural network where the applied error correction scheme can be learned by the error correction system. When the error correction system is implemented using machine learning, the error correction scheme may be implemented in any suitable configuration or using any suitable techniques (e.g., artificial neural network, deep neural network, convolutional neural network, recurrent neural network, autoencoders, reinforcement learning, etc.), fuzzy logic, artificial intelligence ("AI"), deep learning algorithms, deep structured learning hierarchical learning algorithms, support vector machine ("SVM") (e.g., linear SVM, nonlinear SVM, SVM regression, etc.), decision tree learning (e.g., classification and regression tree ("CART"), ensemble methods (e.g., ensemble learning, Random Forests, Bagging and Pasting, Patches and Subspaces, Boosting, Stacking, etc.), dimensionality reduction (e.g., Projection, Manifold Learning, Principal Components Analysis, etc.) and/or deep machine learning algorithms. Non-limiting examples of publicly available machine learning algorithms, software, and libraries that could be utilized within embodiments of the present disclosure include Python, OpenCV, Inception, Theano, Torch, PyTorch, Pylearn2, Numpy, Blocks, TensorFlow, MXNet, Caffe, Lasagne, Keras, Chainer, Matlab Deep Learning, CNTK, MatConvNet (a MATLAB toolbox implementing convolutional neural networks for computer vision applications), DeepLearn Toolbox (a Matlab toolbox for Deep Learning (from Rasmus Berg Palm)), BigDL, Cuda-Convnet (a fast C++/CUDA implementation of convolutional (or more generally, feed-forward) neural networks), Deep Belief Networks, RNNLM, RNNLIB-RNNLIB, matrbm, deeplearning4j, Eblearn.lsh, deepmat, MShadow, Matplotlib, SciPy, CXXNET, Nengo-Nengo, Eblearn, cudamat, Gnumpy, 3-way factored RBM and mcRBM, mPOT, ConvNet, Elektronn, OpenNN, NeuralDesigner, Theano Generalized Hebbian Learning, Apache Singa, Lightnet, and SimpleDNN.

The various embodiments disclosed herein are described with respect to utilization of an artificial neural network (also simply referred to herein as a "neural network"). However, a person of ordinary skill in the art is capable of implementing any appropriate machine learning system or other logical network or optimization system for error correction in a modulator in accordance with embodiments of the present disclosure.

A neural network is typically based on a collection of connected units or nodes referred to as artificial neurons, which loosely model the neurons in a biological brain. Each connection, like the synapses in a biological brain, can transmit a signal to other neurons. An artificial neuron that receives a signal then processes it and can signal neurons connected to it. In neural network implementations, the "signal" at a connection is a real number, and the output of each neuron is computed by some non-linear function of the sum of its inputs (e.g., sigmoid activation). The connections are referred to as edges. Neurons and edges typically have a weight that adjusts as training of the neural network proceeds. The weight increases or decreases the strength of the signal at a connection. Neurons may have a threshold such that a signal is sent only if the aggregate signal crosses that threshold. Typically, neurons are aggregated into layers. Different layers may perform different transformations on their inputs. Signals travel from the first layer (the input layer) to the last layer (the output layer), possibly after traversing the layers multiple times. A neural network architecture may be configured as a feed-forward network with one or more hidden layers, and with a backpropagation learning algorithm. Implementation of a neural network may involve three phases: a training, or learning, phase; a validation phase; and an inference, or production, phase. In the training phase, the neural network essentially learns by comparing its actual output with known correct outputs (or at least outputs that are more near a desired output) to find errors. It then modifies the model accordingly. In the validation phase, the trained neural network is verified by means of data ("validation set"), which may be different from the data used in the training phase. In the inference, or production, phase, the trained and validated neural network is now configured and capable of providing outputs that correspond to any input.

When the error correction system is implemented as a neural network, the neural network may be implemented with any type of hardware and/or software (as will be further disclosed herein), such as within an appropriate set of digital circuitry suitable for implementation of a neural network or other type of machine learning system. The illustration of the neural networks within the figures is not to be limiting upon the scope of embodiments of the present disclosure. Within the various figures, "(A)" represents that the signal is an analog signal, and "(D)" represents that the signal is a digital signal.

Figure 13:
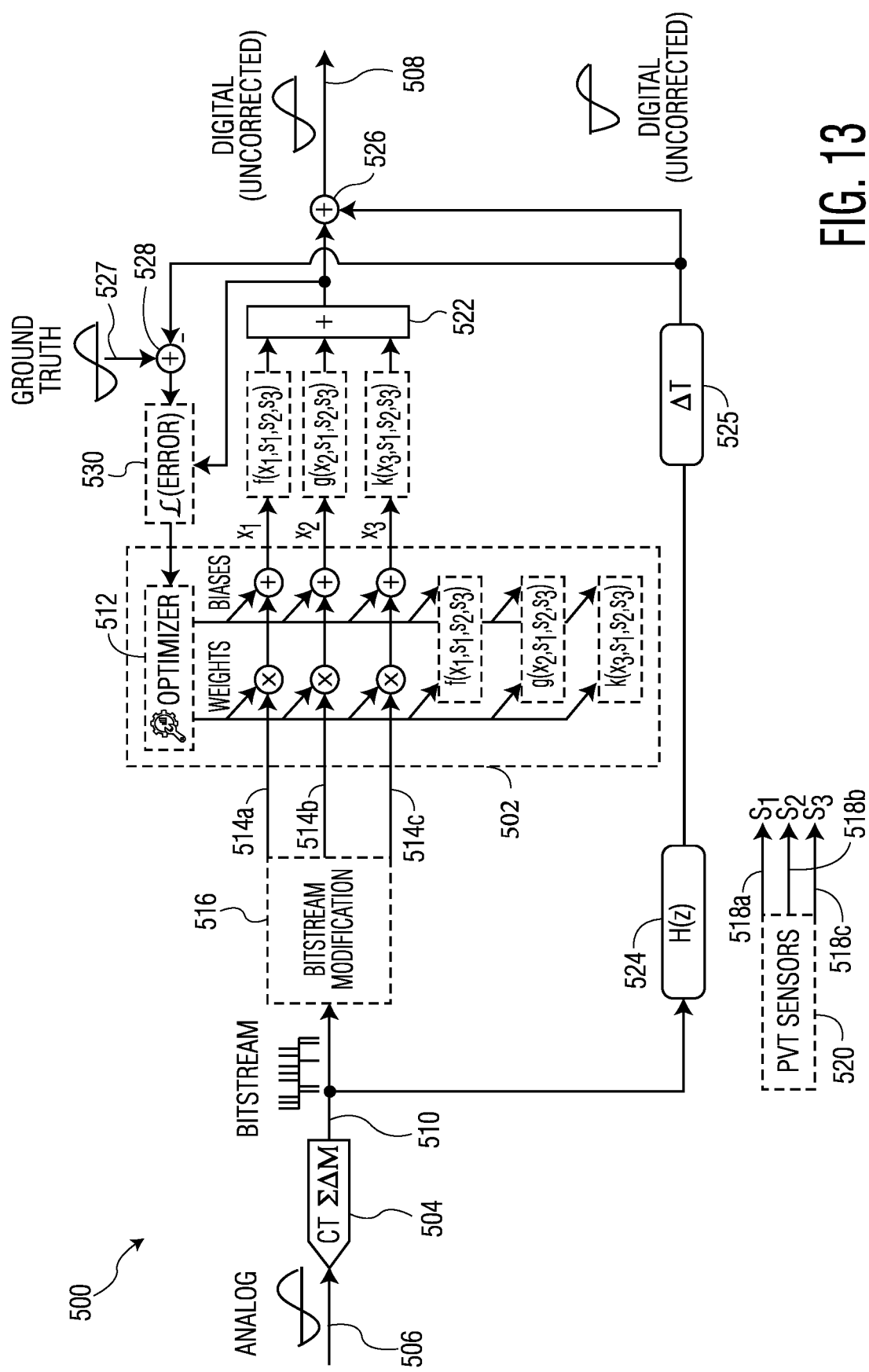
FIG. 13 depicts a system that includes an error correction system configured to correct or minimize errors generated by a sigma-delta modulator due to ISI.

FIG. 13 depicts system 500 that includes an error correction system 502 configured to correct or minimize errors generated by sigma-delta modulator 504 due to ISI. System 500 includes input terminal 506 configured to receive an analog input signal. System 500 is configured to convert that analog input signal into an output digital bit stream at output terminal 508. The magnitudes of the values in the output digital data stream are equivalent to the corresponding magnitude of the analog input signal.

Within system 500, sigma-delta modulator 504 is configured to continuously measure or sample a magnitude of the analog input signal at input terminal 506 and convert that analog value into a corresponding digital output bitstream that is output at output terminal 510 of sigma-delta modulator 504. If sigma-delta modulator 504 were an ideal device, the magnitude of the output digital value 'x' would equal the sampled magnitude of the analog input signal $x_a$ or $x_{analog}$. Instead, however, as described above, the output of sigma-delta modulator 504 includes some ISI such that the magnitude of the digital output bitstream does not precisely equal the sampled magnitude of the analog input signal.

As such, system 500 includes error correction system 502 to make correction to the output of sigma-delta modulator 504 to account for the ISI. In the depicted embodiment, error correction system 502 includes an optimizer 512 that is configured to apply a number of weights (i.e., via multiplication) and a number of bias values (e.g., via addition or subtraction) to the values received via a number of input lines 514a-514c. Within error correction system 502, input lines 514a, 514b, and 514c (though other embodiments of error correction system 502 may include more or fewer bit lines) that are configured to receive signals from bitstream modifier 516 that comprise various modified versions of the bit stream output of sigma-delta modulator 504. Bitstream modifier 516 is described in more detail below.

By applying appropriate weights and biases to the signals being received on the various input lines 514a-514c error correction system 502 generates a number of correction signals that are summed together at summing block 522.

The summed correction signal that is output by block 522 is then combined with a delayed (via delay element 525) and filtered (via filter 524) version of the original output signal of sigma-delta modulator 504 at summing node 526 to generate a corrected output signal at output terminal 508 in which ISI has been removed from the corrected output signal. Delay element 525 is configured to delay the signal received from sigma-delta modulator 504 by an amount equal to the delays inherent within bitstream modifier 516 and error correction system 502. Filter 524 may comprise a low-pass or band-pass filter configured to remove or attenuate signals having frequencies outside of the frequency band of interest or bandwidth of sigma-delta modulator 504 from the signal being supplied to delay element 525.

To enable error correction system 502 to compensate for ISI inherent within the output of sigma-delta modulator 504, bitstream modifier 516 is configured to process the output signal of 504 to generate a plurality of different output signals in which the spectral components of the various output signals of bitstream modifier 516 coincide with the spectral components of the ISI to be removed, such as those depicted in FIGS. 7-10 and described above.

Figure 14:
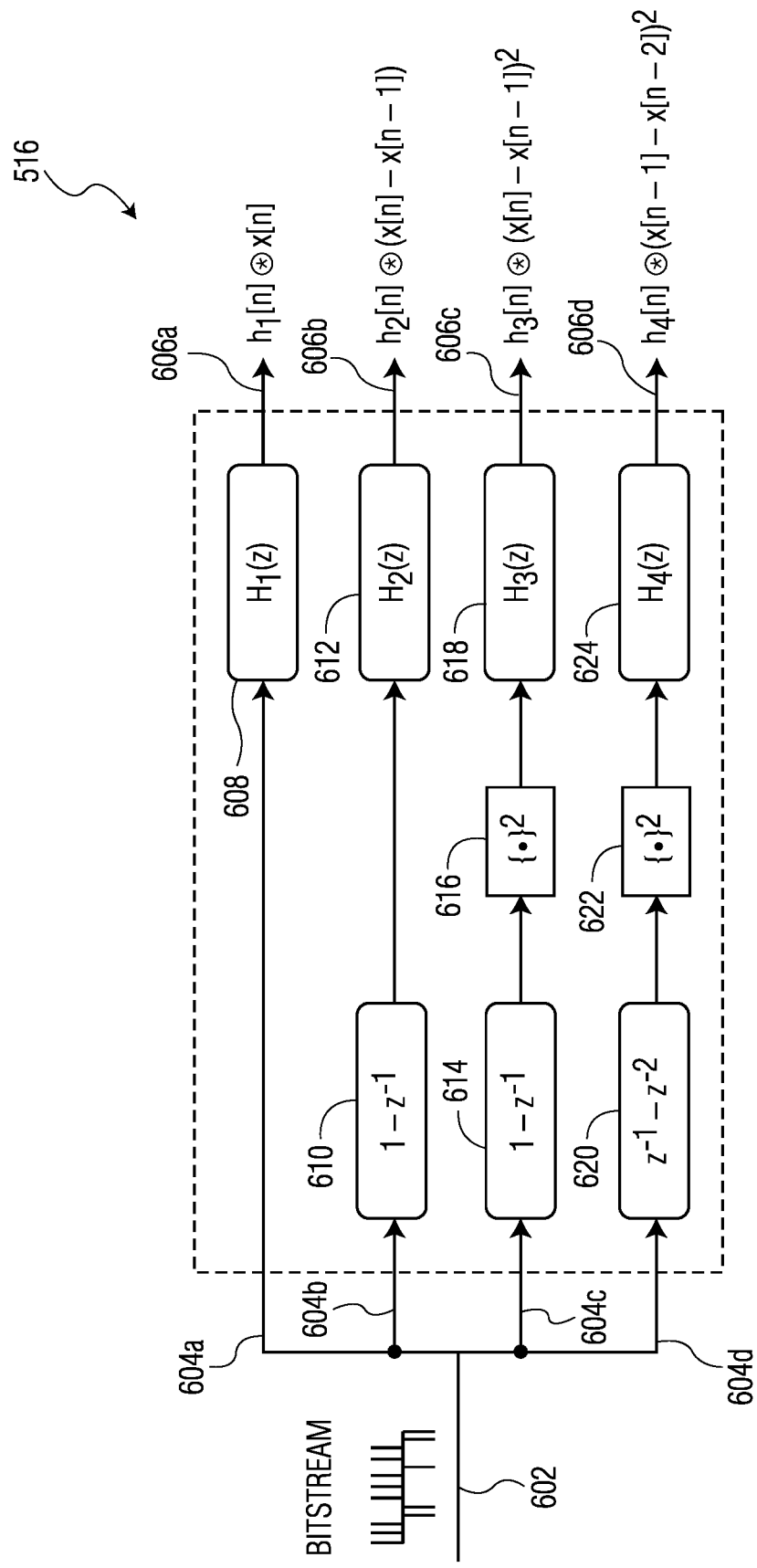
FIG. 14 is a diagram depicting the functional components of a bitstream modifier.

To further illustrate, FIG. 14 is a diagram depicting the functional components of bitstream modifier 516. Specifically, bitstream modifier 516 includes an input terminal 602 configured to receive an input signal that comprises the output signal of a sigma-delta modulator (e.g., sigma-delta modulator 504 of FIG. 13). The signal received at input terminal 602 is then split into a number of signal paths 604a-604d. Each signal path 604a-604d modifies the received input signal to generate output signals at a number of corresponding output terminals 606a-606d.

Signal path 604a is configured to generate a filtered version of the distorted output signal of the sigma-delta modulator received at input terminal 602. As such, signal path 604a includes a filter 608 (which may comprise a low-pass or band-pass filter) configured to remove or attenuate signals having frequencies outside of the frequency band of interest or bandwidth of the sigma-delta modulator from the signal that output at output terminal 606a. As such, the signal output at output terminal 606a is equivalent to the signal that would be fed into the decimator of the sigma-delta modulator if no corrections were applied.

Signal path 604b is configured to generate an output signal at output terminal 606b that is equivalent to the difference between the input signal bitstream received at input terminal 602 and the bitstream with a delay of 1 sample, which is equivalent to a discrete (first order) differentiation. As such, in an example wherein the input signal is a (distorted) sine wave, the difference bitstream output at output terminal 606b will approximate a cos(x) function. Specifically, signal path 604b includes a computation circuit 610 that is configured to determine the difference between the current bitstream value of the input signal and the immediately prior value of the bitstream. That difference value is then supplied to filter 612 (which may comprise a low-pass or band-pass filter) configured to remove or attenuate signals having frequencies outside of the frequency band of interest or bandwidth of the sigma-delta modulator from the signal that is output at output terminal 606a. The filtered difference signal is then output at output terminal 606b.

Signal path 604c is configured to determine the squared version of the difference bitstream and output the squared version at output terminal 606c. As such, the output signal generated at output terminal 606c will be in the form of $\cos(x)^2$. Specifically, signal path 604c includes a logical function circuit 614 that is configured to determine the difference between the current bitstream value of the input signal and the immediately prior value of the bitstream. That difference value is then supplied to squaring function 616, which is configured to output the squared value of that difference value. The squared value is then passed to filter 618 (which may comprise a low-pass or band-pass filter) configured to remove or attenuate signals having frequencies outside of the frequency band of interest or bandwidth of the sigma-delta modulator from the signal that is output at output terminal 606a. The filtered squared difference signal is then output at output terminal 606c.

Signal path 604d is configured to determine the squared version of a further delayed version of the difference bitstream (e.g., the bitstream output at output terminal 606b) and output the delayed squared version at output terminal 606d. As such, the output signal generated at output terminal 606d will be in the form of $\cos(x)^2$, but delayed by one sample. Specifically, signal path 604d includes a logical function circuit 620 that is configured to determine the difference between a version of the bitstream value of the input signal that is delayed by 1 sample and the immediately prior value of the bitstream. That difference value is then supplied to squaring function 622, which is configured to output the squared value of that delayed difference value. The squared value output by squaring function 622 is then passed to filter 624 (which may comprise a low-pass or band-pass filter) configured to remove or attenuate signals having frequencies outside of the frequency band of interest or bandwidth of the sigma-delta modulator from the signal that is output at output terminal 606a. The filtered squared difference signal is then output at output terminal 606d.

In this configuration, the signals output at output terminals 606a-606d of bitstream modifier 516 includes the same spectral components as those found in the ISI signals as depicted in FIGS. 7-10 and described above. Specifically, with reference to FIGS. 7-10, when the input signal is of the form of a sin(x) signal, the ISI noise signals have components that include $\cos(x)^2$ (e.g., as found in falling-edge error signals), $-\cos(x)^2$ (e.g., as found in rising-edge error signals), and sin(x), $\cos(x)^2$ components as found in positive and negative glitch errors. As described above with respect to FIG. 14, those components are all found in the outputs of bitstream modifier 516.

For the squared output signals of bitstream modifier 516 (i.e., generated by signal path 604c and 604d), the squaring functions 616, 622 as positioned before their respective filters 618, 624 such that any signal squaring occurs before filtering. Consequently, in signals paths 604c and 604d, any shaped quantization noise will also produce intermodulation products upon squaring, hence simulating the quantization-noise folding due to ISI which negatively affects the output signal of the sigma-delta modulator. As such, if the modified bitstreams generated at the output terminals 606a-606d of bitstream modifier 516 were to be compared to the expected distortions resulting from ISI, which are illustrated in FIGS. 7-10, the output signal of bitstream modifier 516 have similar spectral content as the distortion components as the expected ISI.

In general, signal paths 604c and 604d are essentially the same signal but shifted by one sample (i.e., the signal path 604d is delayed by one sample with respect to signal path 604c). This offset enables a variation in the ratio between the signal and 2nd order component, while not affecting the quantization-noise compensation. The value of these two offset signals when utilized for ISI noise components is described below.

Figure 15:
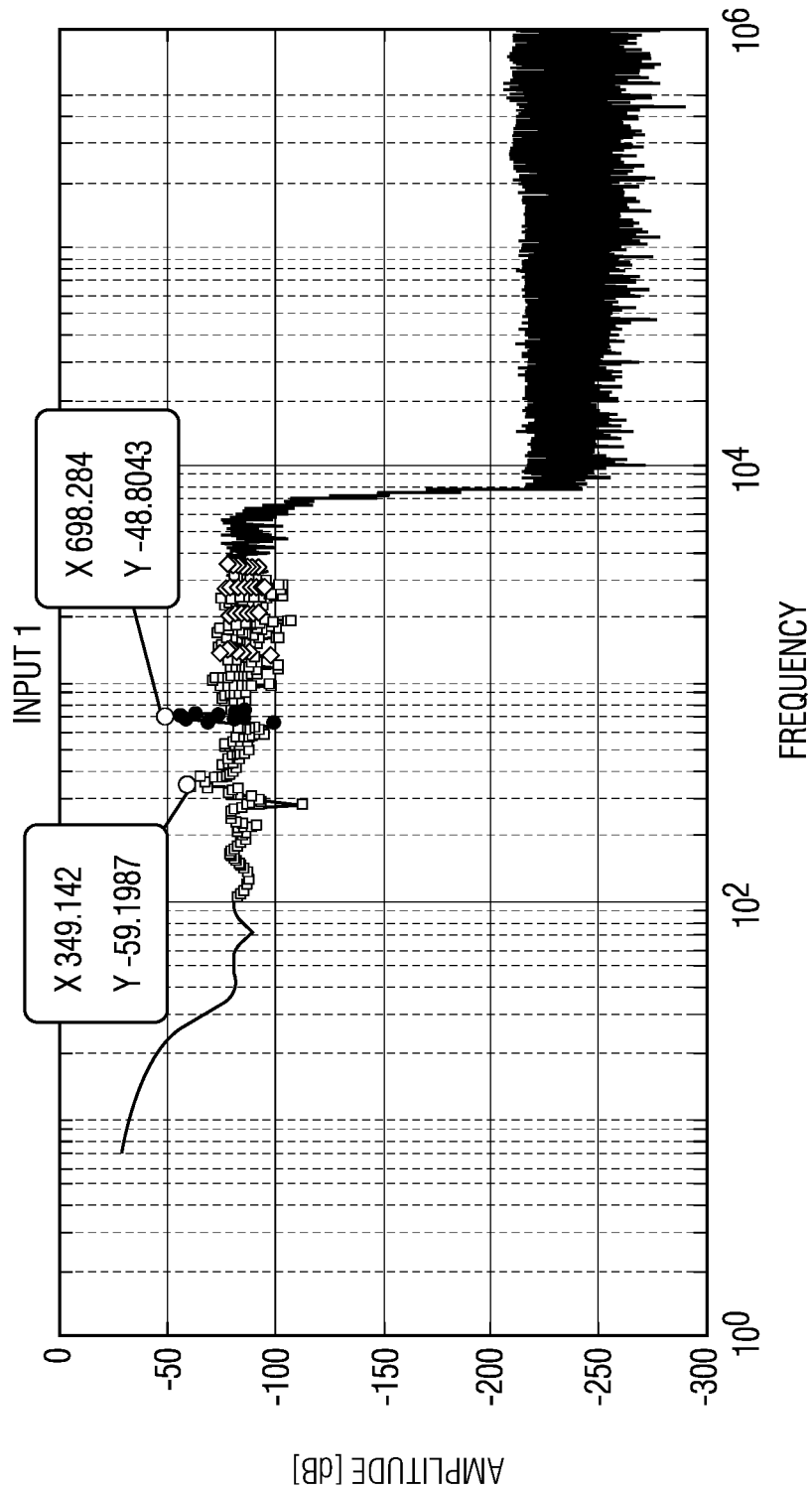
FIG. 15 is a chart depicting the frequency spectrum of one of the signals output by a bitstream modifier.

FIG. 15 is a chart depicting the frequency spectrum of the signals output by bitstream modifier 516 at output terminals 606c and 606d. The horizontal axis represents frequency on a logarithmic scale, while the vertical axis represents magnitude of the respective signals at the corresponding frequency. Because the two bitstreams are delayed versions of each other, the spectrum is identical (as such, only a single signal trace can be viewed in FIG. 15). If an error correction system (e.g., error correction system 502 of FIG. 13) were to perform ISI correction using only a single one of the squared bitstream (e.g., generated by either signal path 604c or signal path 604d of bitstream modifier 516) the resulting correction will result in the ratio of signal component and $2^{nd}$ order component being locked, i.e.

$$\frac{A_{sig}}{A_{2nd}} = c$$

(constant) (in the example of FIG. 15 at −59.2 dB and −48.8 dB. When delaying the squared bitstream (e.g., by delaying the signal of signal path 604c to generate the delayed signal of signal path 604d), a phase shift will occur. The phase shift that occurs depends on the frequency components that are present; when shifting the squared bitstream by one sample, the frequency component $f_{sig}$ will have a phase-shift $\phi_{sig}$ while the second order component $f_{2nd}$ will have a phase shift $\phi_{2nd}$. If the delayed (e.g., the signal of signal path 604d) and the non-delayed (e.g., the signal of signal path 604c) signals, a new signal is generated with a different signal to $2^{nd}$ order component ratio $$\left(\frac{A_{sig,del}}{A_{2nd,del}}\right),$$

as expressed below:

$$\frac{A_{sig,del}}{A_{2nd,del}} = \frac{\sqrt{A_{sig}^2 + A_{sig}^2 + A_{sig}^2 \cos(\phi_{sig})}}{\sqrt{A_{2nd}^2 + A_{2nd}^2 + A_{2nd}^2 \cos(\phi_{2nd})}} \quad \text{Equation (1)}$$

Equation (1) has a different signal to $2^{nd}$ order ratio, but is still not tunable. However, if the weights generated by the error correction system (e.g., the weights generated by error correction system 502 of FIG. 13) are considered, the delayed and non-delayed modified bitstreams can be scaled separately. In that case Equation (1) becomes:

$$\frac{A_{sig,tunable}}{A_{2nd,tunable}} = \frac{A_{sig}}{A_{2nd}} \times \frac{\sqrt{w_1^2 + w_2^2 + w_1 w_2 \cos(\phi_{sig})}}{\sqrt{w_1^2 + w_2^2 + w_1 w_2 \cos(\phi_{2nd})}} \quad \text{Equation (2)}$$

Essentially, in equation (2) the different phase shift that occurs between the signal and the second order component can be magnified or decreased using the weights of the optimizer/neural network in combination with the squared and delayed square signals generated by bitstream modifier 516.

Using all signals generated by bitstream modifier 516, therefore, an error correction system can determine weights and biases that are configured to compensate for various combinations of falling-edge/rising-edge and positive/negative glitch errors.

Returning to FIG. 13, optimizer 512 of error correction system 502 may be trained using training signals that represents a known "ideal" digital signal conversion of the analog input signal. In the configuration shown in FIG. 13, an "ideal" digital signal (i.e., the signal representing the bit stream output of an ideal sigma-delta modulator based upon the analog input signal received at input terminal 506) can be used.

The ideal digital signal received at input terminal 527 is supplied to a first input terminal of summing node 528. The corrected output signal at output terminal 508 is supplied at a negative input terminal of summing node 528. As such, the difference between the ideal digital signal and the corrected digital signal, which represents error, is supplied to cost function 530, which is used to modify optimizer 512 so that the outputs generated by error correction system 502 minimize the magnitude of the error signal (i.e., the difference between the corrected output signal at output terminal 508 and the ideal signal received at input terminal 527).

In accordance with certain embodiments of the present disclosure, one or more process, voltage, temperature (PVT) sensor 520 may optionally be incorporated into system 500 to provide PVT parameters to error correction system 502 so that error correction system 502 can further modify the output of sigma-delta modulator 504 to correct for PVT dependencies wherein the output of sigma-delta modulator 504 varies as a function of the PVT values. As a result, as error correction system 502 is optimized, error correction system 502 will account for PVT effects on the errors generated by sigma-delta modulator 504.

In accordance with various embodiments of the present disclosure any type of process, voltage, or temperature related information could be added as a PVT input to the error correction system 502, such as various technology parameters (e.g., electron mobility, transistor parameters (e.g., Vt, fT, Beta, doping), resistor parameters (e.g., nominal resistor value, voltage dependency), or capacitor parameters (e.g., nominal capacitor value, voltage dependency), voltage parameters (e.g., supply voltage, reference voltage, bias condition on a device), and temperature parameters (e.g., device or system operational temperature). As long as there is a manner in which to measure a process related parameter, then the output of this measurement can be provided as a PVT Input to error correction system 502.

With reference to FIG. 13, PVT sensor 520 is configured to generate output signals s1, s2, and s3 at a number of output terminals 518a, 518b, 518c, respectively, that may each include a PVT parameter value. In various embodiments of system 500, PVT sensors 520 may be configured to measure any number (e.g., one or more) PVT parameter and supply that parameter as an input to error correction system 502. The parameter values (in this case, s1, s2, and s3) are supplied to optimizer 512 of error correction system 502, which is configured to use the parameter values as inputs to one or more functions (e.g., f(x), g(x) and k(x)) configured to determine weight/offset values for the various signal paths being supplied to block 522.

Figure 16:
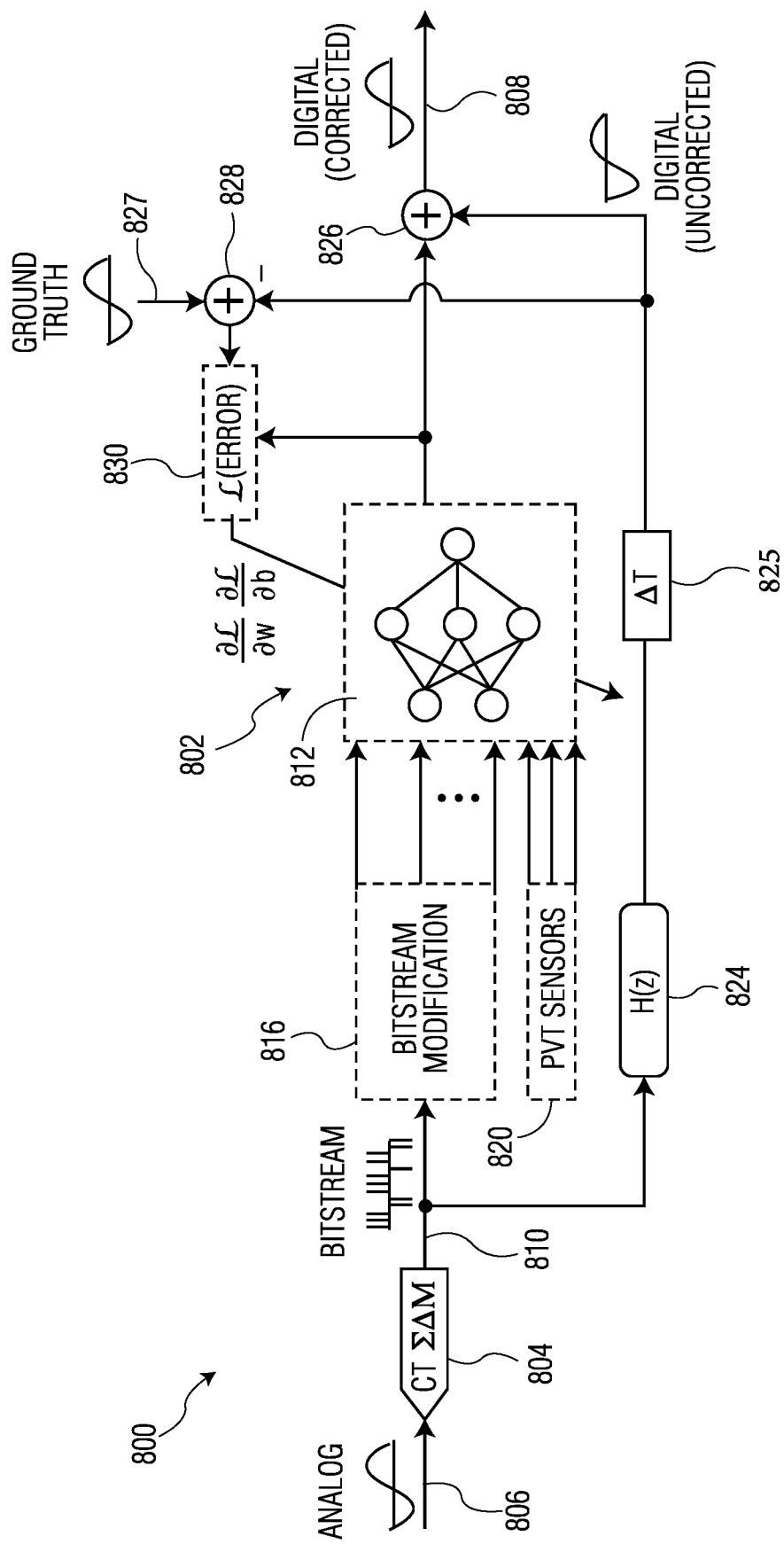
FIG. 16 depicts a system that includes an error correction system configured to correct or minimize errors generated by sigma-delta modulator due to ISI.

In various embodiments, error correction system 502 of FIG. 13 may be implemented using machine learning, such as using a neural network. FIG. 16, for example, depicts system 800 that includes an error correction system 802 configured to correct or minimize errors generated by sigma-delta modulator 804 due to ISI. System 800 includes input terminal 806 configured to receive an analog input signal. System 800 is configured to convert that analog input signal into an output digital bit stream at output terminal 808. The magnitudes of the values in the output digital data stream are equivalent to the corresponding magnitude of the analog input signal.

Within system 800, sigma-delta modulator 804 is configured to continuously measure or sample a magnitude of the analog input signal at input terminal 806 and convert that analog value into a corresponding digital output bitstream that is output at output terminal 810 of sigma-delta modulator 804. If sigma-delta modulator 804 were an ideal device, the magnitude of the output digital value 'x' would equal the sampled magnitude of the analog input signal $x_a$ or $x_{analog}$. Instead, however, as described above, the output of sigma-delta modulator 804 includes some ISI such that the magnitude of the digital output bitstream does not precisely equal the sampled magnitude of the analog input signal.

As such, system 800 includes error correction system 802 to make corrections to the output of sigma-delta modulator 804 to account for the ISI. In the depicted embodiment, error correction system 802 includes a neural network 812 that is configured to apply modifications that the various signals received from bitstream modifier 816 that comprise various modified versions of the bit stream output of sigma-delta modulator 804. Bitstream modifier 816 is implemented in the manner as illustrated in FIG. 14 and described herein. The signals generated by neural network 812 are summed together at summing node 826 where the summed correctional signal is combined with a delayed (via delay element 825) and filtered (via filter 824) version of the original output signal of sigma-delta modulator 804 at summing node 826 to generate a corrected output signal at output terminal 808 in which ISI has been removed from the corrected output signal. Delay element 825 is configured to delay the signal received from sigma-delta modulator 804 by an amount equal to the delays inherent within bitstream modifier 816 and error correction system 802. Filter 824 may comprise a low-pass or band-pass filter configured to remove or attenuate signals having frequencies outside of the frequency band of interest or bandwidth of sigma-delta modulator 804 from the signal being supplied to delay element 825.

Neural network 812 of error correction system 802 may be trained using training signals that represents a known "ideal" digital signal conversion of the analog input signal. In the configuration shown in FIG. 16, an "ideal" digital signal (i.e., the signal representing the bit stream output of an ideal sigma-delta modulator based upon the analog input signal received at input terminal 806).

The ideal digital signal received at input terminal 827 is supplied to a first input terminal of summing node 828. The corrected output signal at output terminal 808 is supplied at a negative input terminal of summing node 828. As such, the difference between the ideal digital signal and the corrected digital signal, which represents error, is supplied to cost function 830, which is used to modify neural network 812 so that the outputs generated by error correction system 802 minimize the magnitude of the error signal (i.e., the difference between the corrected output signal at output terminal 808 and the ideal signal received at input terminal 827).

In accordance with certain embodiments of the present disclosure, one or more process, voltage, temperature (PVT) sensor 820 may optionally be incorporated into system 800 to provide PVT parameters to error correction system 802 so that error correction system 802 can further modify the output of sigma-delta modulator 804 to correct for PVT dependencies. As a result, as error correction system 802 is optimized, error correction system 802 will account for PVT effects on the errors generated by sigma-delta modulator 804.

In accordance with various embodiments of the present disclosure any type of process, voltage, or temperature related information could be added as a PVT input to the error correction system 802, such as various technology parameters (e.g., electron mobility, transistor parameters (e.g., Vt, fT, Beta, doping), resistor parameters (e.g., nominal resistor value, voltage dependency), or capacitor parameters (e.g., nominal capacitor value, voltage dependency), voltage parameters (e.g., supply voltage, reference voltage, bias condition on a device), and temperature parameters (e.g., device or system operational temperature). As long as there is a manner in which to measure a process related parameter, then the output of this measurement can be provided as a PVT Input to error correction system 802.

Figure 17:
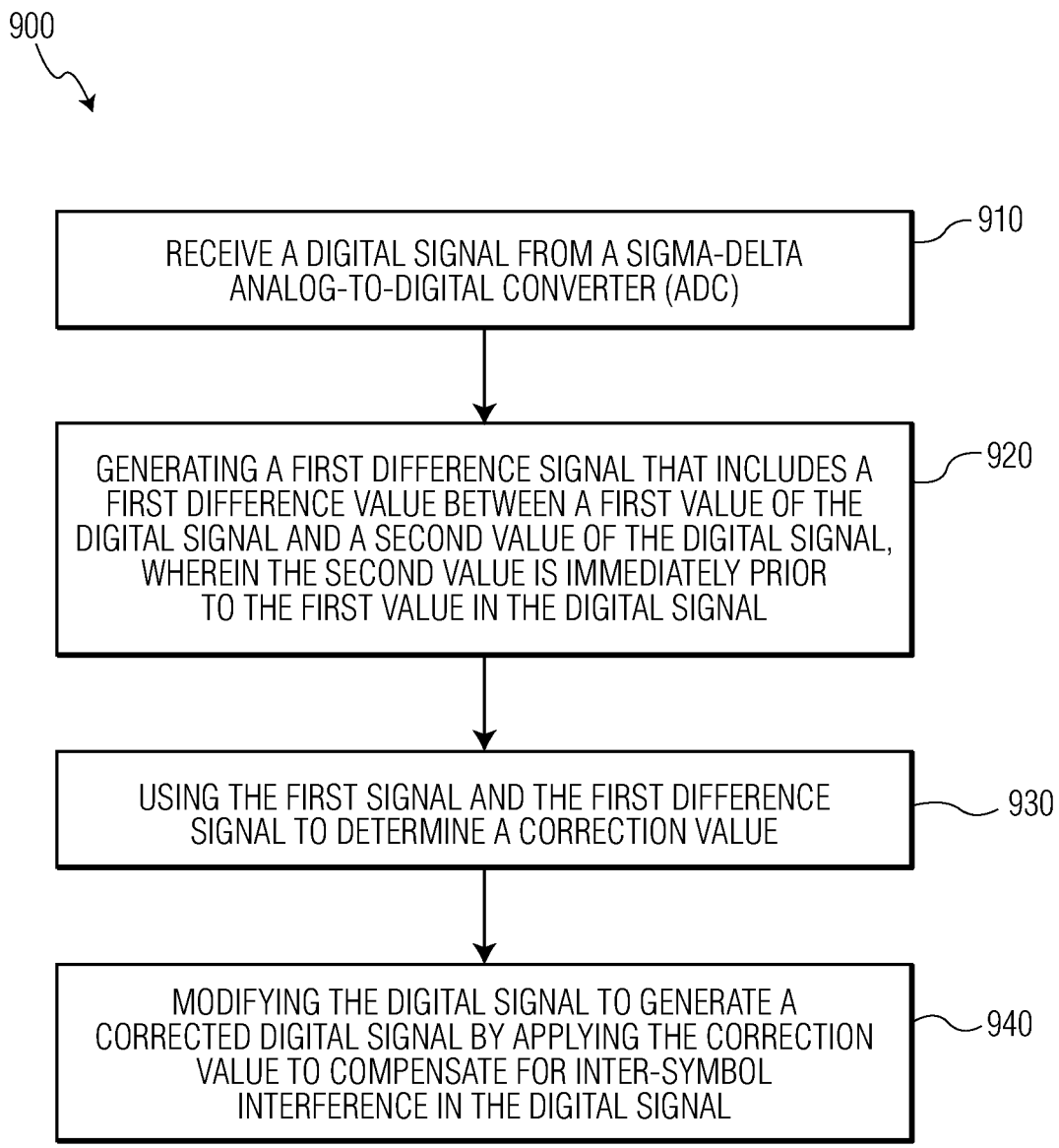
FIG. 17 is a flowchart of an example method for compensating inter-symbol interference in a sigma-delta ADC.

FIG. 17 is a flowchart of an example method for compensating inter-symbol interference in a sigma-delta ADC. Method 900 may be implemented by system 500 of FIG. 13 or system 800 of FIG. 16, for example. At step 910, a digital signal is received from a sigma-delta analog-to-digital converter (ADC). At step 920, a first difference signal is generated, where that first difference signal includes a first difference value between a first value of the digital signal and a second value of the digital signal. The second value is immediately prior to the first value in the digital signal. At step 930, the first signal and the first difference signal are used to determine a correction value. At step 940, the digital signal is modified to generate a corrected digital signal by applying the correction value to compensate for inter-symbol interference in the digital signal.

As has been described herein, various embodiments of the present disclosure implement an error correction system configured to compensate for ADC errors in ADC devices, such as Nyquist and sigma-delta ADC devices. Such an error correction system may include a neural network implemented within hardware and/or software, such as within one or more data processing systems. Nevertheless, the functionalities described herein are not to be limited for implementation into any particular hardware/software platform.

As will be appreciated by one skilled in the art, aspects of the present disclosure may be embodied as a system, process, method, and/or program product. Accordingly, various aspects of the present disclosure (e.g., the machine learning system) may take the form of an entirely hardware embodiment, an entirely software embodiment (including firmware, resident software, micro-code, etc.), or embodiments combining software and hardware aspects, which may generally be referred to herein as a "circuit," "circuitry," "module," or "system." Furthermore, aspects of the present disclosure may take the form of a program product embodied in one or more computer readable storage medium(s) having computer readable program code embodied thereon. (However, any combination of one or more computer readable medium(s) may be utilized. The computer readable medium may be a computer readable signal medium or a computer readable storage medium.)

A computer readable storage medium may be, for example, but not limited to, an electronic, magnetic, optical, electromagnetic, infrared, biologic, atomic, or semiconductor system, apparatus, controller, or device, or any suitable combination of the foregoing, wherein the computer readable storage medium is not a transitory signal per se. More specific examples (a non-exhaustive list) of the computer readable storage medium may include the following: an electrical connection having one or more wires, a portable computer diskette, a hard disk, a random access memory ("RAM"), a read-only memory ("ROM"), an erasable programmable read-only memory ("EPROM" or flash memory), an optical fiber, a portable compact disc read-only memory ("CD-ROM"), an optical storage device, a magnetic storage device, or any suitable combination of the foregoing. In the context of this document, a computer readable storage medium may be any tangible medium that can contain or store a program for use by or in connection with an instruction execution system, apparatus, controller, or device. Program code embodied on a computer readable signal medium may be transmitted using any appropriate medium, including but not limited to wireless, wire line, optical fiber cable, RF, etc., or any suitable combination of the foregoing.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, controller, or device.

The block diagrams in the figures illustrate architecture, functionality, and operation of possible implementations of circuitry, systems, methods, processes, and program products according to various embodiments of the present disclosure. In this regard, certain blocks in the block diagrams (e.g., error correction system 502, 802 and/or neural network 812) may represent a module, segment, or portion of code, which includes one or more executable program instructions for implementing the specified logical function(s). It should also be noted that, in some implementations, the functions noted in the blocks may occur out of the order noted in the figures. For example, two blocks shown in succession may, in fact, be executed substantially concurrently, or the blocks may sometimes be executed in the reverse order, depending upon the functionality involved.

Modules implemented in software for execution by various types of processors may, for instance, include one or more physical or logical blocks of computer instructions, which may, for instance, be organized as an object, procedure, or function. Nevertheless, the executables of an identified module need not be physically located together, but may include disparate instructions stored in different locations which, when joined logically together, include the module and achieve the stated purpose for the module. Indeed, a module of executable code may be a single instruction, or many instructions, and may even be distributed over several different code segments, among different programs, and across several memory devices. Similarly, operational data (e.g., knowledge bases of adapted weights and/or biases described herein) may be identified and illustrated herein within modules, and may be embodied in any suitable form and organized within any suitable type of data structure. The operational data may be collected as a single data set, or may be distributed over different locations including over different storage devices. The data may provide electronic signals on a system or network.

These program instructions may be provided to one or more processors and/or controller(s) of a general-purpose computer, special purpose computer, or other programmable data processing apparatus (e.g., controller) to produce a machine, such that the instructions, which execute via the processor(s) of the computer or other programmable data processing apparatus, create circuitry or means for implementing the functions/acts specified in the block diagram block or blocks.

It will also be noted that each block of the block diagrams, and combinations of blocks in the block diagrams, can be implemented by special purpose hardware-based systems (e.g., which may include one or more graphics processing units) that perform the specified functions or acts, or combinations of special purpose hardware and computer instructions. For example, a module may be implemented as a hardware circuit including custom VLSI circuits or gate arrays, off-the-shelf semiconductors such as logic chips, transistors, controllers, or other discrete components. A module may also be implemented in programmable hardware devices such as field programmable gate arrays, programmable array logic, programmable logic devices, application specific ICs, microcontrollers, systems on a chip, general purpose processors, microprocessors, or the like.

Computer program code, i.e., instructions, for carrying out operations for aspects of the present disclosure may be written in any combination of one or more programming languages, including an object-oriented programming language such as Java, Smalltalk, Python, C++, or the like, conventional procedural programming languages, such as the "C" programming language or similar programming languages, or any of the machine learning software disclosed herein.

These program instructions may also be stored in a computer readable storage medium that can direct a computer system, other programmable data processing apparatus, controller, or other devices to function in a particular manner, such that the instructions stored in the computer readable medium produce an article of manufacture including instructions which implement the functions/acts specified in the block diagram block or blocks.

The program instructions may also be loaded onto a computer, other programmable data processing apparatus, controller, or other devices to cause a series of operational steps to be performed on the computer, other programmable apparatus or other devices to produce a computer implemented process such that the instructions which execute on the computer, other programmable apparatus, or other devices provide processes for implementing the functions/acts specified in the block diagram block or blocks.

In some aspects, the techniques described herein relate to a system, including: a sigma-delta analog-to-digital converter (ADC) configured to convert an analog input signal to a digital signal, wherein the digital signal is a digital approximation of the analog input signal; a bitstream modifier configured to: receive the digital signal from the sigma-delta ADC, output a first signal at a first output terminal, wherein the first signal is based on the digital signal, and output a first difference signal at a second output terminal, wherein the first difference signal includes a first difference value between a first value of the digital signal and a second value of the digital signal, wherein the second value is immediately prior to the first value in the digital signal; and an error correction system, configured to: receive the first signal from the first output terminal of the bitstream modifier, receive the first difference signal from the second output terminal of the bitstream modifier a first input terminal connected to the first output terminal of the bitstream modifier, use the first signal and the first difference signal to determine a correction value, and modify the digital signal to generate a corrected digital signal by applying the correction value.

In some aspects, the techniques described herein relate to a system, including: a sigma-delta analog-to-digital converter (ADC) configured to convert an analog input signal to a digital signal, wherein the digital signal is a digital approximation of the analog input signal; a bitstream modifier, including: an input terminal configured to receive the digital signal from the sigma-delta ADC, a first signal path connected between the input terminal of the bitstream modifier and a first output terminal of the bitstream modifier to output a first signal at the first output terminal, a first filter between the input terminal of the bitstream modifier and the first output terminal of the bitstream modifier, a second signal path connected between the input terminal of the bitstream modifier and a second output terminal of the bitstream modifier, wherein the second signal path includes a first circuit configured to determine a first difference value between a first value of the digital signal and a second value of the digital signal, wherein the second value is immediately prior to the first value in the digital signal, and output the first difference value at the second output terminal as a first difference signal, and a second filter between the first circuit of the second signal path and the second output terminal of the bitstream modifier; and an error correction system, including: a first input terminal connected to the first output terminal of the bitstream modifier, a second input terminal connected to the second output terminal of the bitstream modifier, and a neural network configured to: use the first signal from the first output terminal and the first difference signal from the second output terminal to determine a correction value, and modify the digital signal to generate a corrected digital signal by applying the correction value to compensate for inter-symbol interference in the digital signal.

In some aspects, the techniques described herein relate to a method, including: receive a digital signal from a sigma-delta analog-to-digital converter (ADC); generating a first difference signal that includes a first difference value between a first value of the digital signal and a second value of the digital signal, wherein the second value is immediately prior to the first value in the digital signal; using the first signal and the first difference signal to determine a correction value; and modifying the digital signal to generate a corrected digital signal by applying the correction value to compensate for inter-symbol interference in the digital signal.

The preceding detailed description is merely illustrative in nature and is not intended to limit the embodiments of the subject matter or the application and uses of such embodiments.

As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A system, comprising:
    a sigma-delta analog-to-digital converter (ADC) configured to convert an analog input signal to a digital signal, wherein the digital signal is a digital approximation of the analog input signal;
    a bitstream modifier configured to:
        receive the digital signal from the sigma-delta ADC,
        output a first signal at a first output terminal, wherein the first signal is based on the digital signal, and
        output a first difference signal at a second output terminal, wherein the first difference signal includes a first difference value between a first value of the digital signal and a second value of the digital signal, wherein the second value is immediately prior to the first value in the digital signal; and
    an error correction system, configured to:
        receive the first signal from the first output terminal of the bitstream modifier,
        receive the first difference signal from the second output terminal of the bitstream modifier,
        use the first signal and the first difference signal to determine a correction value, and
        modify the digital signal to generate a corrected digital signal by applying the correction value;
    wherein the bitstream modifier is configured to:
        determine a second difference value between the first value of the digital signal and the second value of the digital signal,
        determine a first squared difference value of the second difference value, and
        output the first squared difference value at a third output terminal of the bitstream modifier.

2. The system of claim 1, wherein the error correction system is configured to receive the first squared difference value from the third output terminal of the bitstream modifier and use the first squared difference signal to determine the correction value.

3. The system of claim 2, wherein the bitstream modifier is configured to:
    determine a third difference value between the second value of the digital signal and a third value of the digital signal, wherein the third value is immediately prior to the second value in the digital signal,
    determine a second squared value of the third difference value, and
    output the second squared difference value of the third difference at a fourth output terminal as a second squared difference signal.

4. The system of claim 3, wherein the error correction system is configured to receive the second squared difference value from the fourth output terminal of the bitstream modifier and use the second squared difference signal from the fourth output terminal to determine the correction value.

5. A system, comprising:
    a sigma-delta analog-to-digital converter (ADC) configured to convert an analog input signal to a digital signal, wherein the digital signal is a digital approximation of the analog input signal;
    a bitstream modifier configured to:
        receive the digital signal from the sigma-delta ADC,
        output a first signal at a first output terminal, wherein the first signal is based on the digital signal, and
        output a first difference signal at a second output terminal, wherein the first difference signal includes a first difference value between a first value of the digital signal and a second value of the digital signal, wherein the second value is immediately prior to the first value in the digital signal; and an error correction system, configured to:
receive the first signal from the first output terminal of the bitstream modifier,
receive the first difference signal from the second output terminal of the bitstream modifier
use the first signal and the first difference signal to determine a correction value, and
modify the digital signal to generate a corrected digital signal by applying the correction value;
wherein the error correction system is configured to receive a parameter value from a sensor, wherein the output of the sigma-delta ADC varies as a function of a value of the parameter and the parameter includes at least one of a semiconductor manufacturing related process variation, a voltage, and a temperature.

6. The system of claim, 5 wherein the bitstream modifier is configured to:
determine a second difference value between the first value of the digital signal and the second value of the digital signal,
determine a first squared difference value of the second difference value, and
output the first squared difference value at a third output terminal of the bitstream modifier.

7. The system of claim 5, wherein the error correction system includes a neural network that has been configured by a training phase to compensate for variations in the output of the sigma-delta ADC using the parameter.

8. A system, comprising:
a sigma-delta analog-to-digital converter (ADC) configured to convert an analog input signal to a digital signal, wherein the digital signal is a digital approximation of the analog input signal;
a bitstream modifier, including:
an input terminal configured to receive the digital signal from the sigma-delta ADC,
a first signal path connected between the input terminal of the bitstream modifier and a first output terminal of the bitstream modifier to output a first signal at the first output terminal,
a first filter between the input terminal of the bitstream modifier and the first output terminal of the bitstream modifier,
a second signal path connected between the input terminal of the bitstream modifier and a second output terminal of the bitstream modifier, wherein the second signal path includes a first circuit configured to determine a first difference value between a first value of the digital signal and a second value of the digital signal, wherein the second value is immediately prior to the first value in the digital signal, and output the first difference value at the second output terminal as a first difference signal, and
a second filter between the first circuit of the second signal path and the second output terminal of the bitstream modifier; and
an error correction system, including:
a first input terminal connected to the first output terminal of the bitstream modifier,
a second input terminal connected to the second output terminal of the bitstream modifier, and
a neural network configured to:
use the first signal from the first output terminal and the first difference signal from the second output terminal to determine a correction value, and
modify the digital signal to generate a corrected digital signal by applying the correction value to compensate for inter-symbol interference in the digital signal.

9. The system of claim 8, wherein the first filter is configured to attenuate signals having frequencies outside a first bandwidth and the second filter is configured to attenuate signals having frequencies outside a second bandwidth and wherein the first bandwidth is equal to the second bandwidth.

10. The system of claim 8, wherein the bitstream modifier includes a third signal path connected between the input terminal of the bitstream modifier and a third output terminal of the bitstream modifier, wherein the third signal path includes:
a second circuit configured to determine a second difference value between the first value of the digital signal and the second value of the digital signal,
a third circuit configured to determine a first squared value of the second difference value, wherein the bitstream modifier is configured to output the first squared value of the second difference at the third output terminal as a first squared difference signal, and
a third filter connected between the third circuit and the third output terminal of the bitstream modifier, the third filter being configured to attenuate signals having frequencies outside a third bandwidth.

11. The system of claim 10, wherein the error correction system includes a third input terminal connected to the third output terminal of the bitstream modifier and the neural network is configured to use the first squared difference signal from the third output terminal to determine the correction value.

12. The system of claim 10, wherein the bitstream modifier includes a fourth signal path connected between the input terminal of the bitstream modifier and a fourth output terminal of the bitstream modifier, wherein the fourth signal path includes:
a fourth circuit configured to determine a third difference value between the second value of the digital signal and a third value of the digital signal, wherein the third value is immediately prior to the second value in the digital signal,
a fifth circuit configured to determine a second squared value of the third difference value, wherein the bitstream modifier is configured to output the second squared value of the third difference at the fourth output terminal as a second squared difference signal, and
a fourth filter connected between the fifth circuit and the fourth output terminal of the bitstream modifier, the fourth filter being configured to attenuate signals having frequencies outside a fourth bandwidth.

13. The system of claim 12, wherein the error correction system includes a fourth input terminal connected to the fourth output terminal of the bitstream modifier and the neural network is configured to use the second squared difference signal from the fourth output terminal to determine the correction value.

14. The system of claim 8, further comprising a sensor configured to provide a parameter to the error correction system, wherein the output of the sigma-delta ADC varies as a function of a value of the parameter.

15. The system of claim 14, wherein the neural network has been configured by a training phase to compensate for variations in the output of the sigma-delta ADC using the parameter.

16. The system of claim 14, wherein the parameter includes at least one of a semiconductor manufacturing related process variation, a voltage, and a temperature.

17. A method, comprising:
- receive a digital signal from a sigma-delta analog-to-digital converter (ADC);
- generating a first difference signal that includes a first difference value between a first value of the digital signal and a second value of the digital signal, wherein the second value is immediately prior to the first value in the digital signal;
- using the first signal and the first difference signal to determine a correction value; and
- modifying the digital signal to generate a corrected digital signal by applying the correction value to compensate for inter-symbol interference in the digital signal;
- determining a second difference value between the first value of the digital signal and the second value of the digital signal;
- determining a first squared difference value of the second difference value; and
- using the first squared difference signal to determine the correction value.

18. The method of claim 17, further comprising:
- determining a third difference value between the second value of the digital signal and a third value of the digital signal, wherein the third value is immediately prior to the second value in the digital signal;
- determine a second squared value of the third difference value; and
- using the second squared difference signal to determine the correction value.

19. A method, comprising:
- receive a digital signal from a sigma-delta analog-to-digital converter (ADC);
- generating a first difference signal that includes a first difference value between a first value of the digital signal and a second value of the digital signal, wherein the second value is immediately prior to the first value in the digital signal;
- using the first signal and the first difference signal to determine a correction value;
- modifying the digital signal to generate a corrected digital signal by applying the correction value to compensate for inter-symbol interference in the digital signal;
- determining a parameter value using a sensor, wherein the parameter includes at least one of a semiconductor manufacturing related process variation, a voltage, and a temperature; and
- using the parameter value to determine the correction value.

20. The method of claim 19, further comprising:
- determining a second difference value between the first value of the digital signal and the second value of the digital signal;
- determining a first squared difference value of the second difference value; and
- using the first squared difference signal to determine the correction value.

* * * * *